(12) United States Patent
Park et al.

(10) Patent No.: US 7,575,370 B2
(45) Date of Patent: Aug. 18, 2009

(54) HEAT TREATMENT APPARATUS AND METHOD OF CALIBRATING THE APPARATUS

(75) Inventors: Youngchul Park, Tokyo-To (JP);
Kazuhiro Kawamura, Tokyo-To (JP);
Yuichi Takenaga, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/561,976

(22) PCT Filed: Jul. 1, 2004

(86) PCT No.: PCT/JP2004/009326

§ 371 (c)(1),
(2), (4) Date: May 22, 2006

(87) PCT Pub. No.: WO2005/004214

PCT Pub. Date: Jan. 13, 2005

(65) Prior Publication Data

US 2007/0195853 A1     Aug. 23, 2007

(30) Foreign Application Priority Data

Jul. 1, 2003    (JP)  ............................ 2003-189330

(51) Int. Cl.
*G01K 15/00* (2006.01)
*G01K 19/00* (2006.01)
*G01K 3/00* (2006.01)

(52) U.S. Cl. ............................ 374/1; 374/137; 432/241

(58) Field of Classification Search ................. 374/1–3
See application file for complete search history.

(56) References Cited

U.S. PATENT DOCUMENTS 5,498,292 A * 3/1996 Ozaki .......................... 118/724

(Continued)

FOREIGN PATENT DOCUMENTS

EP    1 189 261    3/2002

(Continued)

OTHER PUBLICATIONS

Notification of Transmittal of Copies of Translation of the International Preliminary Report on Patentability (Form PCT/IB/338)—PCT/JP2004/009326, dated Jan. 2004.

(Continued)

*Primary Examiner*—Patrick J Assouad
*Assistant Examiner*—Bret Adams
(74) *Attorney, Agent, or Firm*—Smith, Gambrell & Russell, LLP (57) ABSTRACT

The present invention provides precise temperature estimation in a heat treatment apparatus that estimates temperatures of process objects by using a thermal model and performs a heat treatment while performing a temperature control based on the estimated temperatures. The heat treatment apparatus (1) includes a processing vessel (11) accommodating plural wafers W, plural heaters (31 to 33) and plural temperature sensors (S1 to S5), and stores the thermal model. The heat treatment apparatus 1 estimates temperatures of the wafers W based on outputs of the temperature sensors (S1 to S5) by using the thermal model and controls the heaters (31 to 33) based on the estimated temperatures, applying a heat treatment to the wafers W. The thermal model for an individual apparatus is made by calibrating a standard thermal model designed for a standard apparatus. The standard model calibration is performed by heating an interior of the processing vessel (11), measuring the temperatures of the wafers W in the processing vessel (11), estimating the temperatures of the wafers W by using the thermal model, comparing the measured temperature and the estimated temperature, and calibrating the standard thermal model so that the measured temperature substantially coincides with the estimated temperature.

6 Claims, 9 Drawing Sheets

U.S. PATENT DOCUMENTS

| | | | |
|---|---|---|---|
| 5,517,594 | A | 5/1996 | Shah et al. |
| 6,193,506 | B1 * | 2/2001 | Muka ......................... 432/241 |
| 6,622,104 | B2 * | 9/2003 | Wang et al. ................... 702/99 |
| 7,139,627 | B2 * | 11/2006 | Obara et al. .................. 700/96 |
| 2001/0054386 | A1 * | 12/2001 | Saito .......................... 118/724 |
| 2002/0014483 | A1 * | 2/2002 | Suzuki et al. ............... 219/486 |
| 2002/0069025 | A1 | 6/2002 | Wang et al. |
| 2004/0115585 | A1 * | 6/2004 | Makiya et al. .............. 432/247 |

FOREIGN PATENT DOCUMENTS

| | | |
|---|---|---|
| JP | 59-108119 | 6/1984 |
| JP | 2002-025997 | 1/2002 |
| JP | 2002-124481 | 4/2002 |
| JP | 2002-130961 | 5/2002 |
| JP | 2002-141347 | 5/2002 |

OTHER PUBLICATIONS

PCT International Preliminary Report on Patentability (Form PCT/IB/373)—PCT/JP2004/009326, dated Jan. 2004.

Translation of PCT Written Opinion of the International Searching Authority—(Form PCT/ISA/237)—PCT/JP2004/009326, dated Jan. 2004.

* cited by examiner

| PRESET (TARGET) TEMPERATURE | MEASURED TEMPERATURE | | | | | ESTIMATED TEMPERATURE | | | | |
|---|---|---|---|---|---|---|---|---|---|---|
| | TC1 | TC2 | TC3 | TC4 | TC5 | TP1 | TP2 | TP3 | TP4 | TP5 |
| 500°C | 490°C | 480°C | 490°C | 490°C | 480°C | 500°C | 500°C | 500°C | 500°C | 500°C |
| 600°C | 587°C | 570°C | 590°C | 590°C | 585°C | 600°C | 600°C | 600°C | 600°C | 600°C |
| ...... | ...... | ...... | ...... | ...... | ...... | ...... | ...... | ...... | ...... | ...... |
| 1100°C | 1090°C | 1070°C | 1086°C | 1090°C | 1080°C | 1100°C | 1100°C | 1100°C | 1100°C | 1100°C |

HEAT TREATMENT APPARATUS AND METHOD OF CALIBRATING THE APPARATUS

TECHNICAL FIELD

This invention relates to a calibrating method for a heat treatment apparatus that performs a heat treatment to a process object, such as a semiconductor wafer. Particularly, the invention relates to a method of calibrating a thermal model of a heat treatment apparatus that estimates the temperature of a process object accommodated in the apparatus by using the thermal model and performs a control based on the estimation result.

BACKGROUND ART

In a batch-type heat treating apparatus that performs a heat treatment, such as a film deposition process, an oxidation process or a diffusion process, to a number of semiconductor wafers collectively, process conditions, such as process temperature, process pressure and gas flow rate, are determined beforehand depending on the sort of a film to be formed and the film thickness, etc., and recipes describing the above process conditions are prepared. The operator selects a recipe corresponding to the sorts of a film and the film thickness, and the heat treatment apparatus operates under predetermined process conditions.

The heat treatment apparatus performs a treatment while controlling the process conditions, such as process temperature, process pressure, gas flow rate etc., so that they coincide with respective target values defined in the recipe. In order to perform the treatment, it is necessary to measure temperatures of the wafers, pressure in a heating furnace, gas flow rates and so on.

The pressure in the heating furnace can be measured relatively precisely by a pressure gauge. Similarly, the gas flow rate can be measured relatively precisely by a mass-flow controller having a flowmeter or the like disposed in a supply pipe. However, it is difficult to measure wafer temperatures. For example, a technique of accommodating a wafer holding a temperature sensor in the heating furnace is conceivable. In this case, however, it becomes impossible to build a semiconductor element on a wafer's portion equipped with the temperature sensor. Moreover, there is a possibility that impurities originated from the temperature sensor contaminate the whole interior of the heating furnace, reducing a yield ratio of semiconductor devices.

A technique for solving these problems is disclosed in Japanese Patent Publication JP2002-25997A and U.S. Pat. No. 5,517,594. With this technique, plural temperature sensors are arranged in a heating furnace. Based on the outputs of the temperature sensors and the electric power supplied to the heaters etc., temperatures of wafers are estimated momentarily by using a thermal model (mathematical model). The electric power supplied to the heaters is controlled by using the estimated values. According to this technique, it is possible to control a heat treatment apparatus while the temperatures of the wafers are estimated relatively precisely in non-contact manner.

The thermal model for the above apparatus is established as follows. First, a thermal model (standard model) is made for a standard apparatus. Then, the standard model is applied to apparatuses having the same structure. Next, setup work is performed to compensate for a slight equipment-difference (individual difference) between the standard apparatus and individual apparatuses. This work is carried out by performing a deposition process for setup by using each individual apparatuses, and by correcting the thermal model based on the difference between the deposited film thickness and the target film thickness so that the individual apparatuses can form films of the same thickness irrespective of the equipment-difference among the individual apparatuses.

The differences between the standard apparatus and the individual apparatuses include not only a difference relating to heat but also differences relating to gas flow rate and gas pressure. In other words, there are deviations in measurements of the pressure gauge and the gas flowmeter among the individual apparatuses.

Nevertheless, the conventional setup technique is constructed so that the thermal-model correction also absorbs equipment-differences derived from all the factors except heat, and eliminates the individual difference among the apparatuses in appearance, in order to form the identical films in all the apparatuses. Such a setup technique is very effective, because it is not necessary to perform in-depth analysis of the differences among the apparatuses in order to obtain apparatuses of substantially the same specification.

In the above conventional setup technique, however, the thermal situation of the apparatus is not clear in some cases. For instance, if the thermal model cannot absorb the equipment-differences, it is not clear which part of the apparatus causes a deviation in the processing result (e.g., deviation in film thickness in the deposition process). In other words, it is impossible to grasp the thermal characteristics of the individual apparatuses precisely.

DISCLOSURE OF THE INVENTION

The present invention has been made under the aforementioned circumstances, and an object of the present invention is to enable more precise temperature estimation in a heat treatment apparatus that estimates temperature of a process object and performs a heat treatment based on the estimated temperature.

Another object of the present invention is to enable more precise grasp of a thermal characteristics of a heat treatment apparatus that estimates temperature of a process object and performs a heat treatment based on the estimated temperature.

In order to attain the above objects, according to a first aspect of the present invention, there is provided a calibrating method for a heat treatment apparatus that includes a processing vessel for accommodating a process object therein, a plurality of heaters and a plurality of temperature sensors; that stores a thermal model for estimating temperature of the process object in the processing vessel based on outputs of the temperature sensors; that estimates the temperature of the process object in the processing vessel based on the outputs of the temperature sensors by using the thermal model; and that controls the heaters based on the estimated temperature, to perform a heat treatment to the process object, said method including the steps of: driving the heaters to heat an interior of the processing vessel; measuring temperature in the processing vessel; and calibrating the thermal model so that estimated value of the temperature substantially coincide with the actual measurement value of the temperature, upon comparison of the measured temperature in the processing vessel with temperature of the process object estimated by using the thermal model.

According to the above method, it is possible to calibrate the thermal model to be in conditions suitable for the heat treatment apparatus, allowing proper temperature estimation. Thus, a heat treatment process can be performed appropriately. In particular, it is possible to eliminate a deviation between the estimated temperature and the actual temperature which is caused by specific thermal characteristics of the heat treatment apparatus. Consequently, for example, if the change in temperature during a heat treatment process coincides with the change in estimated temperature while the processing result is disappointing one, it can be readily determined that the disappointing processing result is attributable to any factor except heat.

In one embodiment, the processing vessel is capable of accommodating a plurality of process object; and the temperature measuring step includes a step of arranging the temperature sensors adjacent to the process objects and a step of measuring the temperatures of the process objects by means of the temperature sensors thus arranged.

In one embodiment, the calibrating step calculate a correction value for the estimated value based on the measured temperature and the estimated temperature, and calibrates the thermal model so that the estimated value is corrected by using the correction value.

In one embodiment, the heating step drives the heaters to sequentially set the interior of the processing vessel to preset temperatures of a plurality of levels; the temperature measuring step measures temperatures in the processing vessel at the preset temperatures, respectively; a step of estimating the temperature of the process object estimates temperature of the interior of the processing vessel under the preset temperature of each of the levels; and the calibrating step calibrating step calculates correction values for the estimated values based on the measured temperatures and the estimated temperatures, and calibrates the thermal model so that the estimated values estimated by the thermal model are corrected by using the correction values.

In one embodiment, the thermal model has a function of estimating temperature of the heater and temperatures of the temperature sensors; and the calibrating step calculates a correction value based on a relationship between an amount of change in the temperature of the heater and an amount of change in the measured temperature of each of the temperature sensors, and also based on a difference between the temperature of one of the temperature sensors located closest to the heater estimated by using the thermal model and that actually measured, and calibrates the thermal model so that a estimated value is corrected based on the correction value.

In one embodiment, an inside heater is arranged in the processing vessel; the thermal model has a function of estimating temperature of the inside heater; and the calibrating step calculates a correction value based on a relationship between an amount of change in the temperature of the inside heater and an amount of change in the measured temperature of each of the temperature sensors, and also based on a difference between the temperature of one of the temperature sensors located closest to the inside heater estimated by using the thermal model and that actually measured, and calibrates the thermal model so that a estimated value is corrected based on the correction value.

In one embodiment, first and second heaters are arranged above and below the process object in the processing vessel, respectively; the thermal model has a function of estimating temperatures of the first and second heaters; and the calibrating step calculates a first correction value based on a relationship between an amount of change in the temperature of the first heater and an amount of change in the measured temperature of each of the temperature sensors, and also based on a difference between the temperature of one of the temperature sensors located closest to the first heater estimated by using the thermal model and that actually measured; and calculates a second correction value based on a relationship between an amount of change in the temperature of the second heater and an amount of change in the measured temperature of each of the temperature sensors, and also based on a difference between the temperature of one of the temperature sensors located closest to the second heater estimated by using the thermal model and that actually measured; and calibrates the thermal model so that a estimated value is corrected based on the first and second correction values.

The process object may be heat treated by estimating temperature in the processing vessel by using the thermal model calibrated by the above calibrating method, and by applying a heat treatment on a process object based on the estimated temperature.

In order to attain the aforesaid object, according to the second aspect of the present invention, there is provided a heat treatment apparatus that includes a processing vessel for accommodating a process object therein, a plurality of heaters and a plurality of temperature sensors; that stores a thermal model for estimating temperature of the process object in the processing vessel based on outputs of the temperature sensors; that estimates the temperature of the process object in the processing vessel based on the outputs of the temperature sensors by using the thermal model; and that controls the heaters based on the estimated temperature, to perform a heat treatment to the process object, said apparatus comprising: means for driving the heaters to heat an interior of the processing vessel; means for measuring temperatures of the process object in the processing vessel; and means for calibrating the thermal model so that estimated value of the temperature substantially coincide with the actual measurement value of the temperature, upon comparison of the measured temperature in the processing vessel with temperature of the process object estimated by using the thermal model.

According to the present invention, the thermal model is well-adapted to an individual treatment apparatus by customizing the thermal model according to the thermal characteristics of the individual heat treatment apparatus.

DESCRIPTION OF REFERENCE SIGNS 1 heat treatment apparatus
11 processing vessel
15 lower end
21 lid body
24 rotary table
26 boat
31 circumference heater
31a main heater
31b upper sub-heater
31c lower sub-heater
32 top heater
33 bottom heater
100 controller
S1~S5 temperature sensors
TC1~TC5 thermocouples (temperature sensors)

BEST MODE FOR CARRYING OUT THE INVENTION

An embodiment where a batch-type heat treatment apparatus of the present invention is applied to a vertical heat treatment apparatus will be described.

Figure 1:
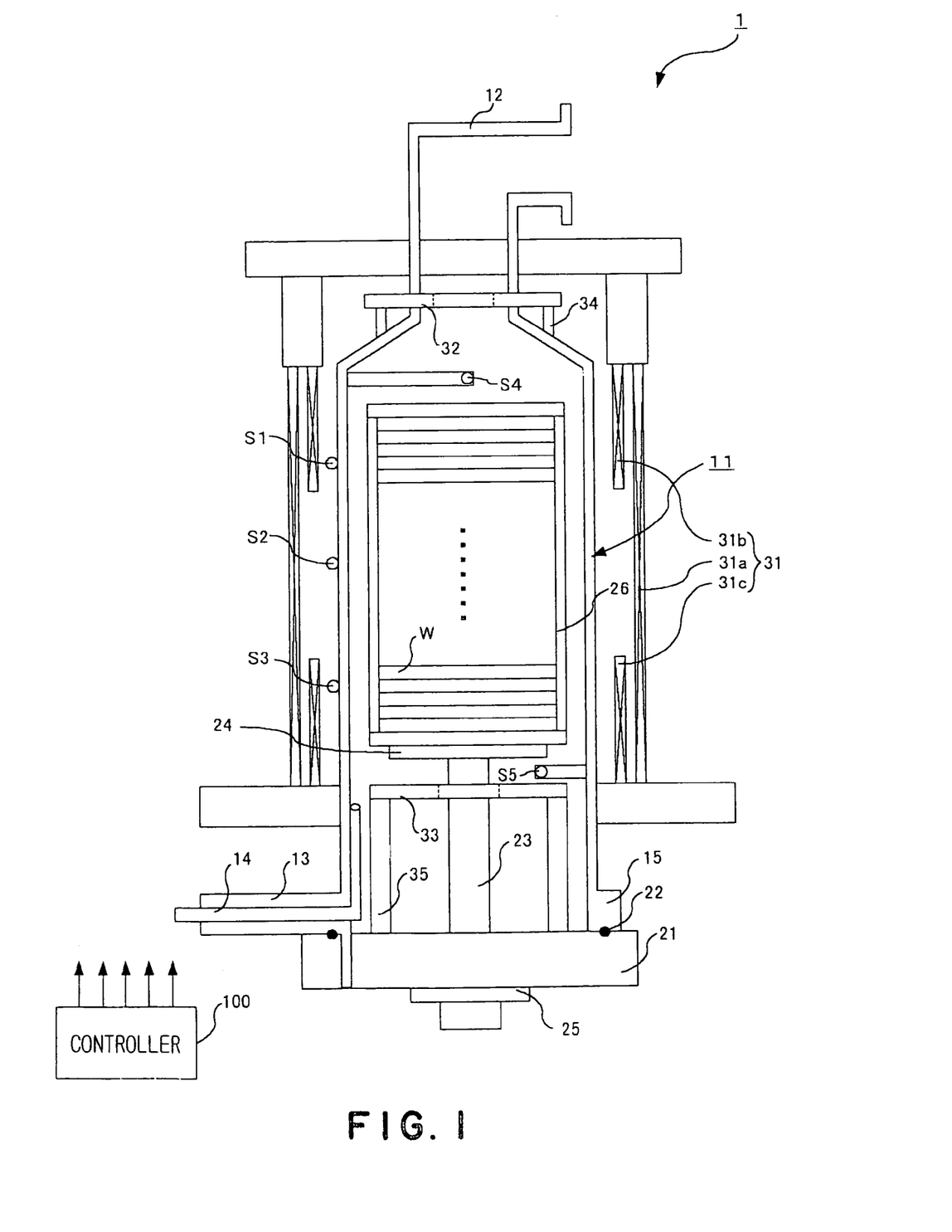
FIG. 1 is a view showing a constitution of a heat treatment apparatus in one embodiment of the present invention.

As shown in FIG. 1, a vertical type heat treatment apparatus 1 in this embodiment includes a processing vessel (reaction tube) 11. The processing vessel 11 is accommodates wafers W, which are process objects, to perform a designated heat treatment, for example, a CVD treatment, to the wafers W. The processing vessel 11 is formed of a heat-resistant and corrosion-resistant material, such as silica glass. The processing vessel 11 has a single-tube structure with its upper and lower ends being opened. The upper end of the single tube is narrowed to have a narrower diameter, forming an exhausting part 12. The exhausting part 12 is connected to a vacuum pump etc. through a not-shown exhaust pipe.

A gas introductory part (introduction port) 13 for introducing a processing gas and an inert gas into the processing vessel 11 is arranged in a lower part of the processing vessel 11. One or more gas supply pipes 14 in communication with a gas source are inserted into the gas introductory part 13. The processing gas introduced from the gas introductory part 13 rises in the processing vessel 11, is used for a designated heat treatment of the wafers W, and then is discharged from the exhausting part 12.

The lower end of the processing vessel 11 in a form of a flange is opened and closed by a lid body 21 formed of a heat-resistant, corrosion-resistant material, such as a stainless steel. The lid body 21 moved up and down by a not-shown elevator. The lid body 21 seals up the lower end 15 of the processing vessel 11 in its elevated position, and opens the lower end 15 of the processing vessel 11 in its lowered position. An O-ring 22 is interposed between the lower end 15 of the processing vessel 11 and the lid body 21 to ensure the air-tightness.

A rotating post 23 stands up rotatably at a central part of the lid body 21. A rotary table 24 is fixed to the upper end of the rotating post 23. A lower part of the lid body 21 is provided with a driving unit 25 for rotating the rotating post 23.

Mounted on the rotary table 24 is a silica glass boat (wafer boat) 26, which is capable of holding e.g. sixty semiconductor wafers W at regular intervals with respect to the height direction. The boat 26 is mounted on the rotary table 24 when the lid body 21 is lowered. When the lid body 21 is moved up to seal up the lower end 15 of the processing vessel 11, the loading of wafers into the processing vessel 11 is completed. After completing a treatment, lowering of the lid body 21 allows the wafers to be unloaded. During the treatment, the driving unit 25 rotates the rotary table 24 to rotate the wafers W, so that the wafers W are subjected to a uniform heat treatment.

The processing vessel 11 is surrounded by a circumference heater 31 for heating the wafers W accommodated in the processing vessel 11 through its circumference. The circumference heater 31 is formed by e.g. rod-shaped resistance heating elements, which are arrayed in a cylindrical form and are arranged in vertical posture so as to encircle the circumference of the processing vessel 11. The circumference heater 11 comprises a main heater 31a for heating the whole circumference of the processing vessel 11, an upper sub-heater 31b for heating a circumference of an upper end portion of the processing vessel 11 and a lower sub-heater 31c for heating a circumference of a lower end portion of the processing vessel 11. The main heater 31a and the sub-heaters 31b and 31c are arranged in a circumferential direction of the processing vessel 11, alternately.

A top heater 32 and a bottom heater 33 are arranged above and below the processing vessel 11, respectively.

The top heater 32 is provided to prevent temperature of the wafers from falling due to heat radiation of the processing vessel 11 on its exhaust side. The top heater 32 has a ring shape extending around the exhausting part 12, and is fixed to a support body 35 through supporting members 34.

The bottom heater 33 is provided to prevent temperature of the wafers from falling due to heat radiation through the lid body 21, and is fixed to the lid body 21 through supporting members 34 to locate under the rotary table 24 in the processing vessel 11. The bottom heater 33 has a ring shape to allow the rotating post 23 to penetrate the center part of the heater 33.

Three temperature sensors S1 to S3 are arranged in a vertical row on the circumference of the processing vessel 11. The temperature sensor S1 is arranged in a position corresponding to an upper section of the boat 26; the temperature sensor S2 in a position corresponding to an intermediate section of the boat 26; and the temperature sensor S3 is arranged in a position corresponding to a lower section of the boat 26.

A temperature sensor S4 is arranged in a position between the top heater 32 and a top face of the boat 26 in the processing vessel 11. A temperature sensor S5 is arranged in a position between the bottom heater 33 and the rotary table 24 in the processing vessel 11. The temperature sensors S4 and S5 are accommodated in, for example, a silica tube to prevent metal contamination.

As mentioned later, outputs (detected temperatures) of the temperature sensors S1 to S5 are used to estimate respective surface temperatures of the wafers W on the boat 26, the top heater 32 and the bottom heater 33.

The heat treatment apparatus 1 includes a controller 100 for performing a control operation of the whole apparatus.

Figure 2:
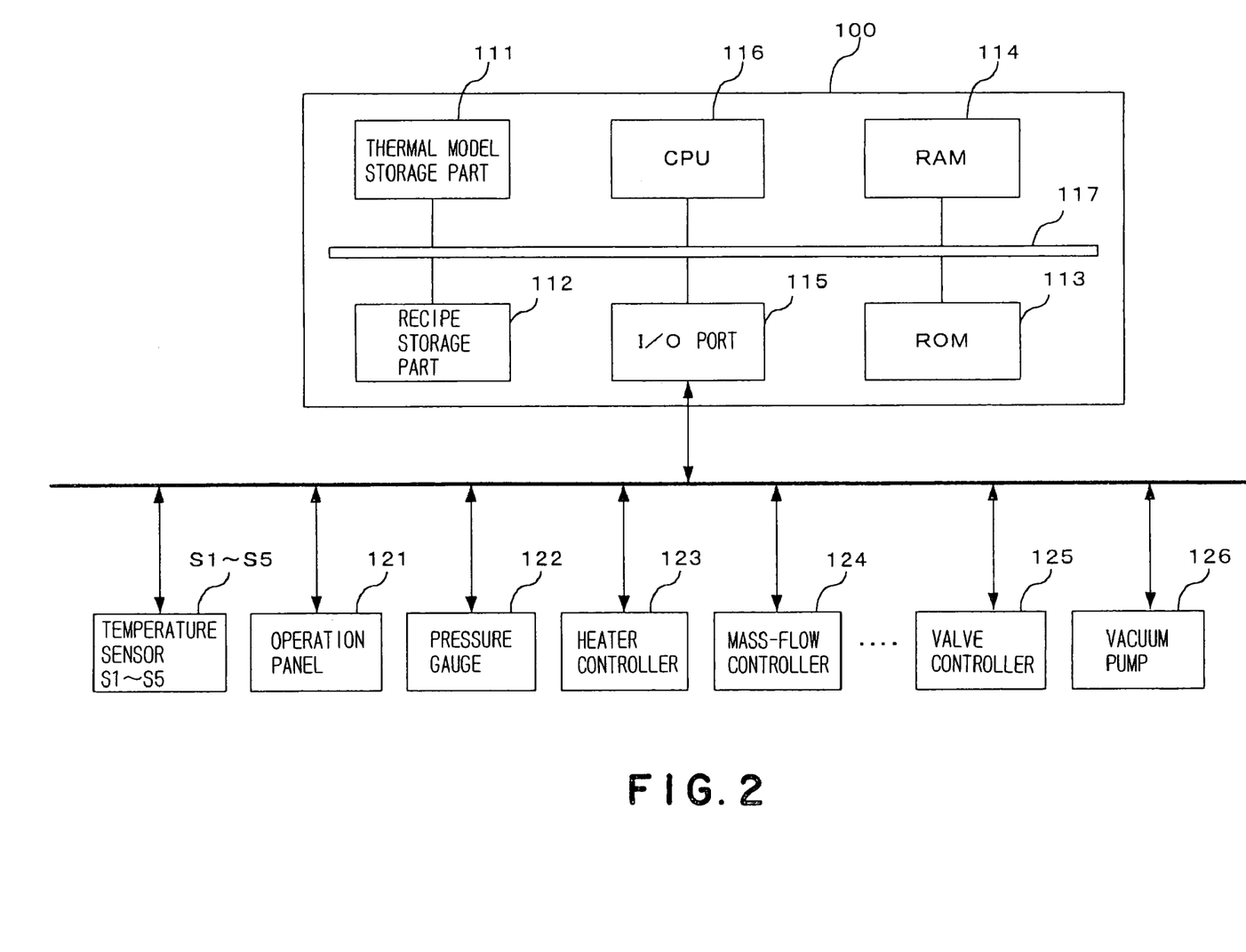
FIG. 2 is a diagram showing a constitution of a controller shown in FIG. 1.

As shown in FIG. 2, the temperature sensors S1 to S5, an operating panel 121, pressure gauges (a group of gauges) 122, a heater controller 123, a mass-flow controller 124, a valve controller 125, a vacuum pump 126, etc. are all connected to the controller 100.

As mentioned before, the temperature sensors S1 to S5 detect the temperatures of the outer wall surface of the processing vessel 11 and the temperatures of vicinities of the top heater 32 and the bottom heater 33, and send them to the controller 100.

The operating panel 121 includes a display screen and operating buttons, transmits the operator's instructions to the controller 100, and displays various information from the controller 100 on the display screen.

The pressure gauges (a group of gauges) 122 detect pressures of respective parts in both the processing vessel 11 and the exhausting part 12, and send the detected values to the controller 100.

The heater controller 123 is provided to control the heaters 31a, 31b, 31c, 32 and 33 individually. In response to commands from the controller 100, the heater controller 123 energizes the heaters 31a, 31b, 31c, 32 and 33 to heat them. The heater controller 123 detects respective power consumptions of the heaters 31a, 31b, 31c, 32 and 33 individually, and sends them to the controller 100.

A mass-flow controller 124 is arranged in each pipe to control the flow rate of a gas flowing through the pipe to an amount instructed by the controller 100, and detects an actual flow rate of gas and sends it to the controller 100.

A valve controller 125 is arranged in each pipe to control the opening of a valve disposed in each pipe to a value instructed by the controller 100. A vacuum pump 126 is connected to the exhausting part 12 of the processing vessel 11 through an exhaust pipe, and evacuates the interior of the processing vessel 11.

As shown in FIG. 2, the controller 100 comprises a thermal model storage part 111, a recipe storage part 112, a ROM 113, a RAM 114, an I/O port 115, a CPU 116, and a bass 117 connecting them with each other.

Figure 3:
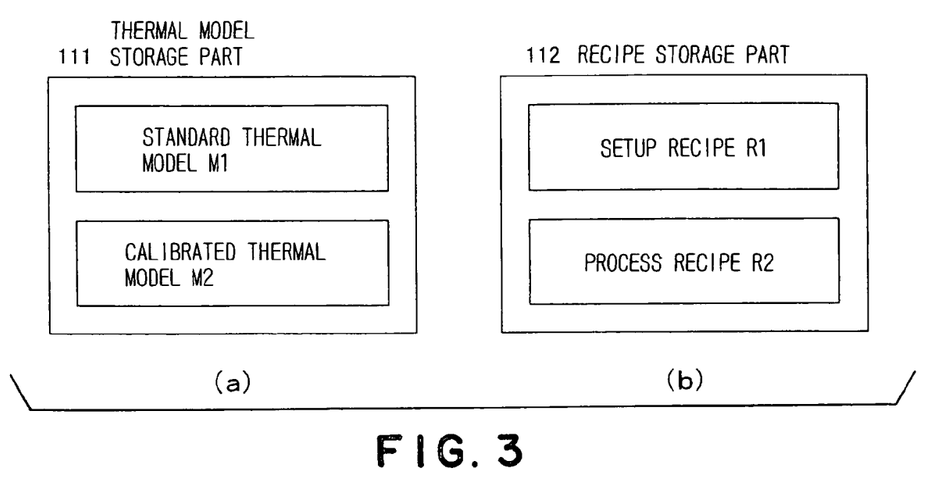
FIG. 3 is a chart showing an example of data stored in a thermal model storage part and a recipe storage part shown in FIG. 2.

As shown in FIG. 3(a), stored in the thermal model storage part 111 are a standard thermal model M1 which is made by using a standard apparatus having the same specification as that of the heat treatment apparatus 1, and a calibrated thermal model M2 which is made by calibrating (customizing) the standard thermal model M1 to be adapted to this heat treatment apparatus 1. At the manufacturing of this heat treatment apparatus 1, only the standard thermal model M1 is stored in the thermal model storage part 111 and subsequently, the calibrated thermal model M2 is stored with a setup procedure of the heat treatment apparatus 1.

Each of the standard thermal model M1 and the calibrated thermal model M2 is a model (mathematical model; high-order multidimensional matrix) for estimating temperatures in the processing vessel 11 based on the output signals (measured temperatures) of the temperature sensors S1 to S5, electric power supplied to the heaters 31a to 33 (i.e., instruction values representing electric power supplied from the heater controller 123 connected to the heaters 31a to 33) and so on.

The standard thermal model M1 is one made by using the standard apparatus, which is commonly used by a plurality of heat treatment apparatuses 1 of the same specification. The calibrated thermal model M2 is one made by calibrating the standard thermal model M1 to reflect the thermal characteristics of the individual apparatus, and is used for which is used for the actual operation (treatment).

More in detail, based on the output signals (measured temperatures) of the sensors S1 to S5 and the electric power supplied to the heaters 31a to 33 etc., the standard thermal model M1 estimates: the temperatures of a center part P1 and a peripheral part P2 of a wafer W (boat top wafer) held on an upper portion of the boat 26; the temperature of a center part P3 of a wafer W (boat center wafer) held on an intermediate portion of the boat 26; the temperatures of a center part P4 and a peripheral part P5 of a wafer W (boat bottom wafer) held on a lower portion of the boat 26 (i.e. temperatures in five positions in total); the surface temperatures of the top heater 32 and the bottom heater 33; and the temperatures of the temperature sensors S4 and S5. Note that the temperature of a peripheral part of the boat center wafer W is not measured, because the intermediate portion of the boat 26 is the most thermally-stable area where very little temperature difference exists between the center part P3 of the wafer W and its peripheral part and therefore, the temperature of the center part P3 of the boat center wafer can represent the temperatures of all the parts of the boat center wafer.

The standard thermal model M1 calculates, by using respective estimated wafer temperatures, electric powers to be supplied to the heaters 31a to 33 in order to make the wafer temperatures equal to temperatures (target values) defined by a recipe. Note that, as to a technique of making the thermal model in itself, a technique disclosed in U.S. Pat. No. 5,517,594 is available.

The calibrated thermal model M2 has the same structure as the standard thermal model M1, except that the model M2 is customized in view of the thermal characteristics specific to this heat treatment apparatus 1 so that the model M2 can estimate the temperatures of respective parts precisely.

As shown in FIG. 3(b), the recipe storage part 112 stores a setup recipe R1 and one or more process recipes R2.

Figure 4:
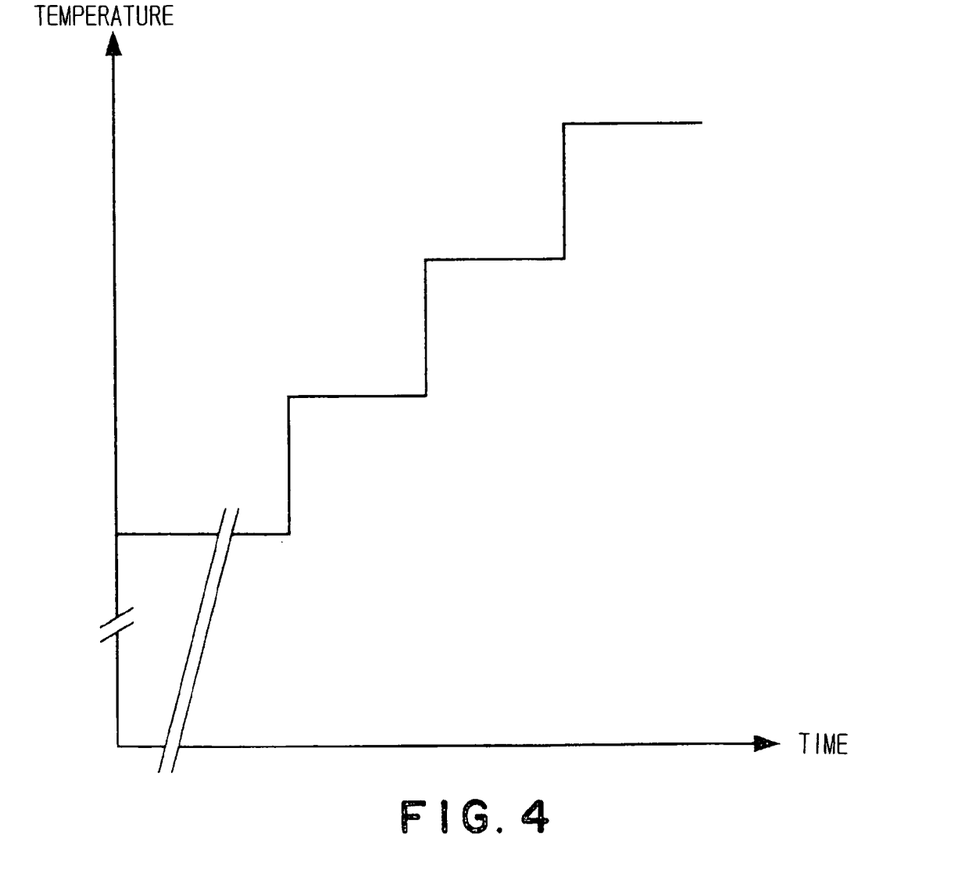
FIG. 4 is a graph showing an example of a setup recipe.

At the manufacturing of this heat treatment apparatus 1, only the setup recipe R1 is stored. The setup recipe R1 is executed when calibrating the standard thermal model M1 of the heat treatment apparatus 1. The setup recipe R1 defines the raise in temperature in the aforementioned positions P1 to P5 with respect to time in a step-like manner as shown in FIG. 4.

The process recipes R2 are prepared for respective heat treatments (processes) performed by a user.

The ROM 113 shown in FIG. 2 is a storage medium such as an EEPROM, a flash memory and/or a hard disc drive, and stores an operation program etc. for the CPU 116. The RAM 114 functions as a working area etc. for the CPU 116.

The I/O port 115 is connected to the temperature sensors S1 to S5, the operating panel 121, the pressure gauges 122, the heater controller 123, the mass-flow controllers 124 and the valve controller 125 to control the inputting and outputting of data, signals, etc.

The bass 117 transmits information among respective parts.

The CPU (Central Processing Unit) 116 is a center of the controller 100, executing control programs stored in the ROM 113 and controls the operation of the heat treatment apparatus 1 in accordance with a recipe stored in the recipe storage part 112, to follow the instructions from the operating panel 121.

Figure 5:
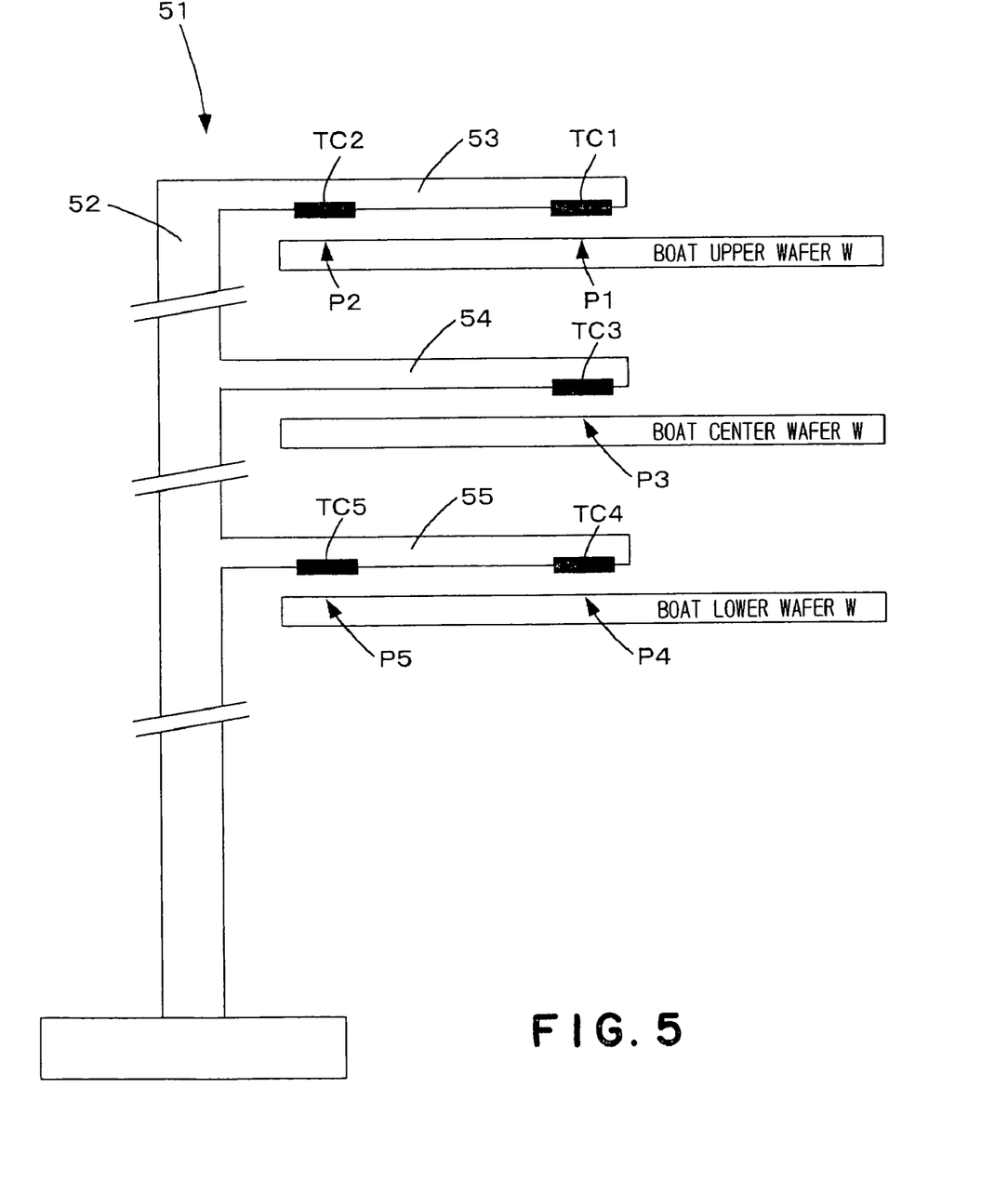
FIG. 5 is a view showing a constitution of a temperature measurement device.

Next, a temperature measurement apparatus 51 used in the setup operation of the heat treatment apparatus 1 will be described.

Figure 6:
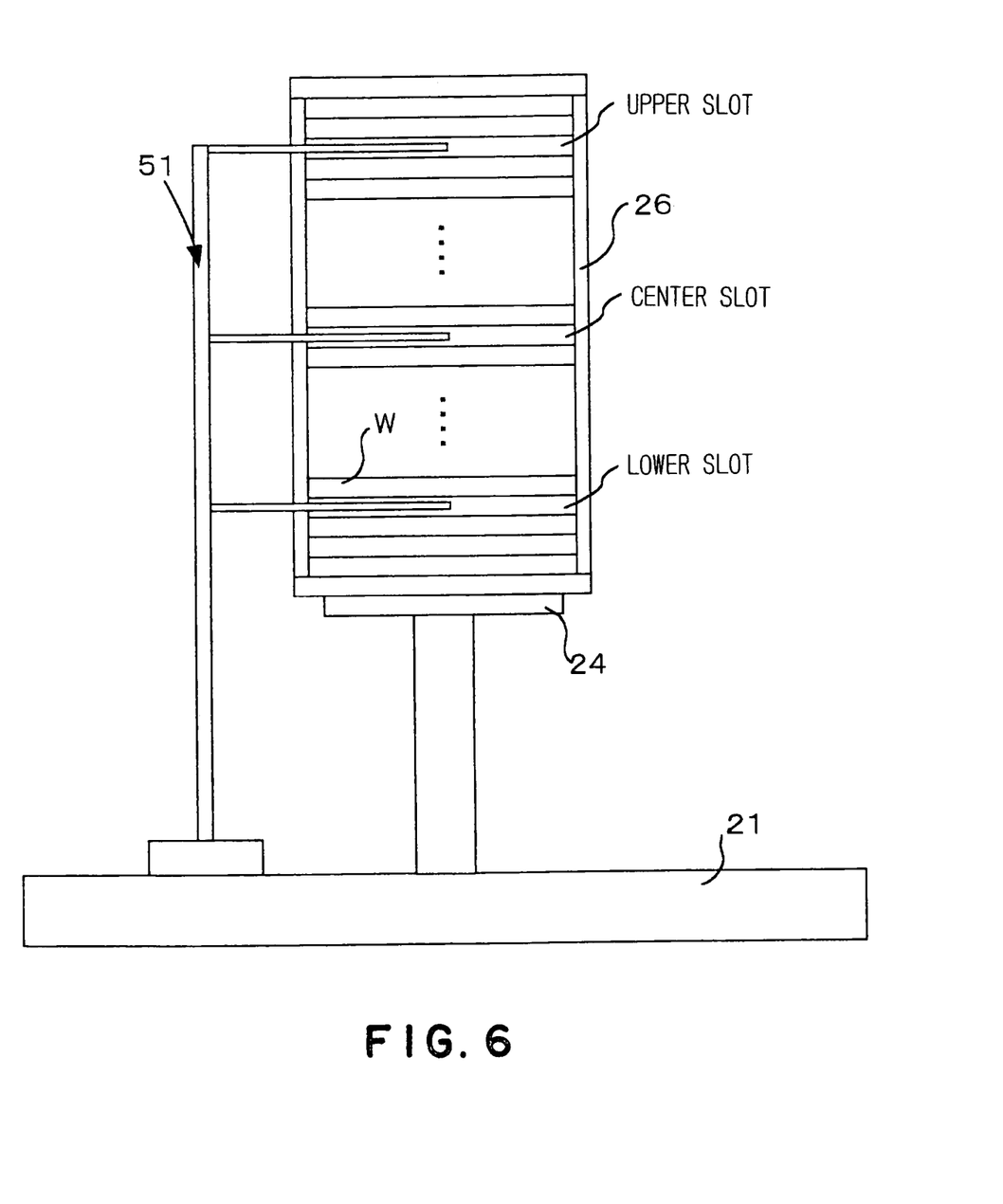
FIG. 6 is a view showing a state where arm parts of the temperature measurement device are inserted into a boat.

As shown in FIG. 5, the temperature measurement apparatus 51 includes a supporting column 52, and first, second and third arms 53, 54, 55 all extending from the supporting column 52 horizontally. As shown in FIG. 6, the first to third arms 53, 54, 55 are arranged in positions to allow them to be inserted sideways into an upper slot, a center slot and a lower slot of the boat 26, respectively. The first to third arms 53 to 55 are equipped with thermocouples (temperature sensors) TC1 to TC5.

On the first arm 53, the thermocouples TC1 and TC2 are arranged in positions that respectively oppose the center part P1 and the peripheral part P2 of the wafer W in an upper slot of the boat 26 when the arm 53 is inserted into the boat 26.

On the second arm 54, the thermocouple TC3 is arranged in a position that opposes the center part P3 of the wafer W in a center slot of the boat 26 when the arm 54 is inserted into the boat 26.

On the third arm 55, the thermocouples TC4 and TC5 are arranged in positions that respectively oppose the center part P4 and the peripheral part P5 of the wafer W in a lower slot of the boat 26 when the arm 55 is inserted into the boat 26.

The thermocouples TC1 to TC5 are arranged in the vicinity of respective temperature-monitoring wafers W (e.g., boat-upper-slot wafer, boat-center-slot wafer and boat-lower-slot wafer) in non-contact manner, and are capable of measuring the surface temperatures of areas P1 to P5 of the wafers W to be subjected to temperature measurement. Output signal lines of these thermocouples TC are connected to the I/O port 115 of the controller 100, when the setup operation is performed.

Figure 7:
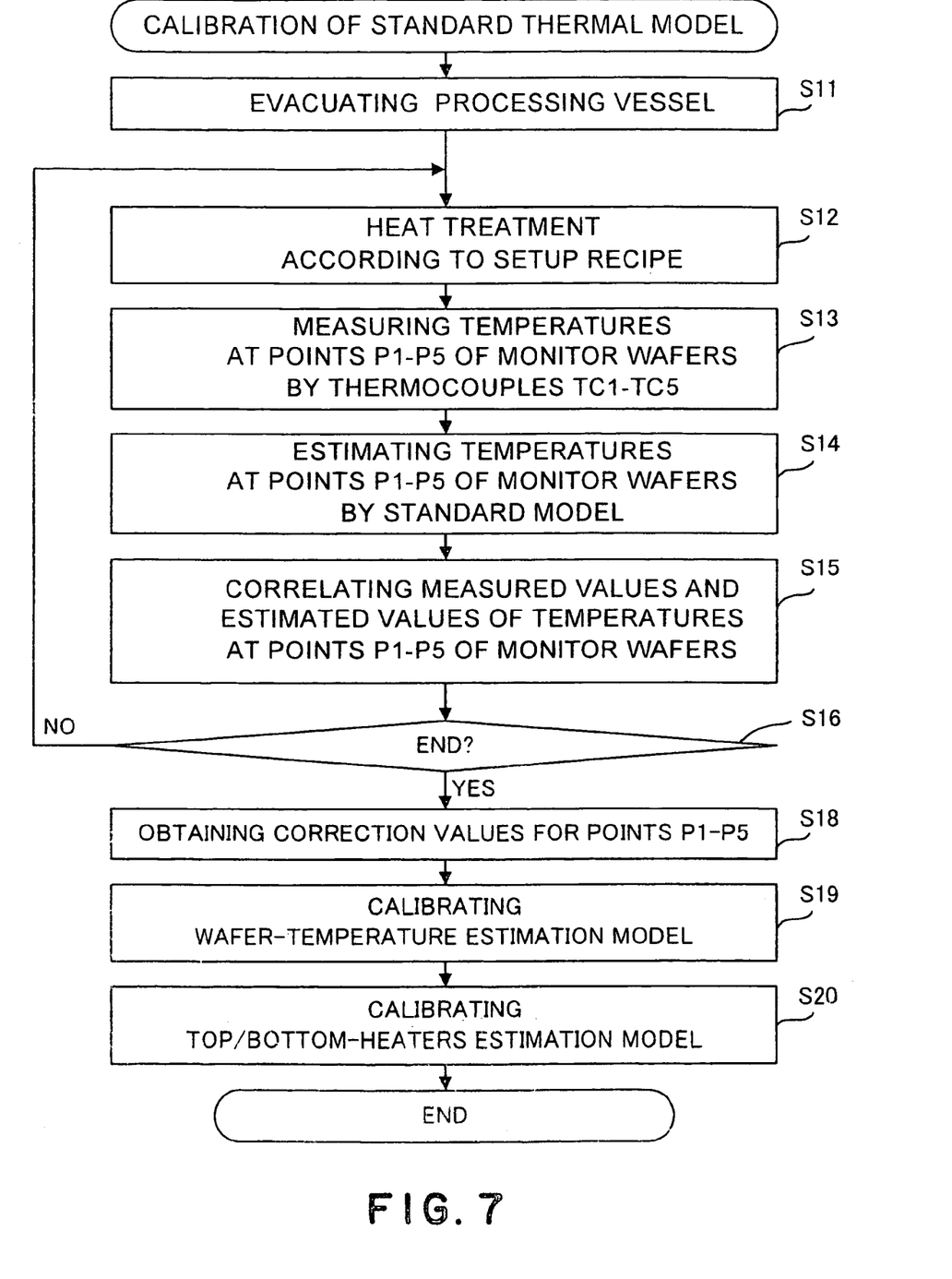
FIG. 7 is a flow chart for explanation of a procedure that a standard thermal model is calibrated to produce a calibrated thermal model.
Figure 8:
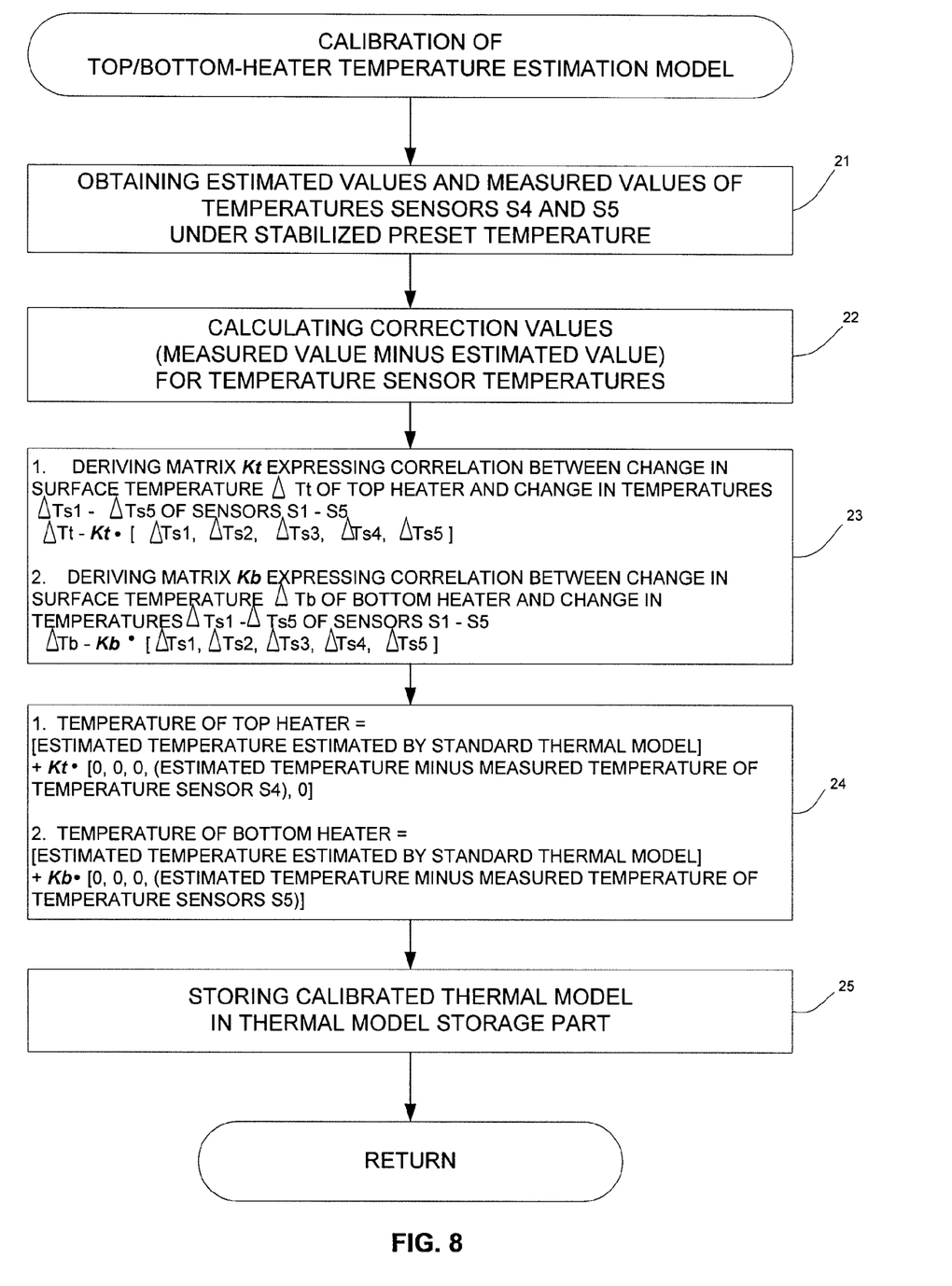
FIG. 8 is a flow chart for explanation of a procedure that a standard thermal model is calibrated to produce a calibrated thermal model.

Next, the setup operation of the heat treatment apparatus 1 will be described with reference to flow charts of FIG. 7 and FIG. 8. This setup operation is an operation to detect differences in thermal characteristics between the individual heat treatment apparatus 1 and the standard apparatus due to delicate differences therebetween, and calibrates the standard thermal model M1 stored in the thermal model storage part 111 to make a calibrated thermal model M2 specific to the heat treatment apparatus 1.

First, by an operator, the lid body 21 is lowered to mount the boat 26 holding wafers W (e.g., dummy wafers) on the rotary table 24. The temperature measurement apparatus 51 is inserted into the boat 26 sideways. Next, the lid body 21 is moved up to load the boat 26 into the processing vessel 11.

Next, the operator instructs to start the calibration of the standard thermal model M1 by means of the operating panel 121.

In response to this instruction, the controller 100 (the CPU 116) starts the operation in accordance with a calibration program stored in the ROM 113.

First, the controller 100 controls the valve controller 125, the vacuum pump 126, etc. while monitoring the output of the pressure gauge 122 to evacuate the interior of the processing vessel 11 to a designated pressure (step S11).

Next, according to the setup recipe R1, temperatures in the areas P1 to P5 of the wafers W in the processing vessel 11 are set to a first temperature (e.g., 400° C.) (step S12).

At that time when temperatures of the wafers W are stabilized, the actual temperatures in the positions P1 to P5 of the center parts and the peripheral parts of respective the wafers W (e.g. temperature-monitoring wafers) are measured by using the thermocouples TC1 to TC5 (step S13). While, temperatures in the positions P1 to P5 of the center parts and the peripheral parts of respective temperature-monitoring wafers W are estimated by using the standard thermal model M1 (step S14).

Next, the measured values (actual measurement values), the estimated values and the correspondence therebetween are stored in the RAM 114 (step S15).

Next, it is judged whether or not treatments for all temperatures defined by the setup recipe R1 have been completed (step S16). If not completed, in other words, a treatment(s) for a certain set temperature is left undone (in step S16, "No"), the routine returns to step S12 where the similar treatment for the set temperature is repeated.

On the other hand, when the treatments for all temperatures defined in the setup recipe R1 (step S16; Yes), the routine goes to step S18. At this time, a correspondence table showing the correspondence between the measured values and the estimated values shown in FIG. 9 has been made in the RAM 114.

At step 18, based on the correspondence table made in the RAM 114, the temperatures measured by the thermocouples TC1 to TC5 are compared with the temperatures TP1 to TP5 estimated by using the standard thermal model M1, respectively, and correction values for the temperatures of the wafers W are calculated.

Although any technique may be used for calculating the correction values, they may be calculated, for example, in accordance with the following mathematical expression 1.

Correction value $i = TPi$ (estimated value by the standard thermal model $M1$) $- Tri$ (measured value)  [Expression 1]

where i: the number (1-5) indicating temperature-estimation areas (P1 to P5)

Figure 9:
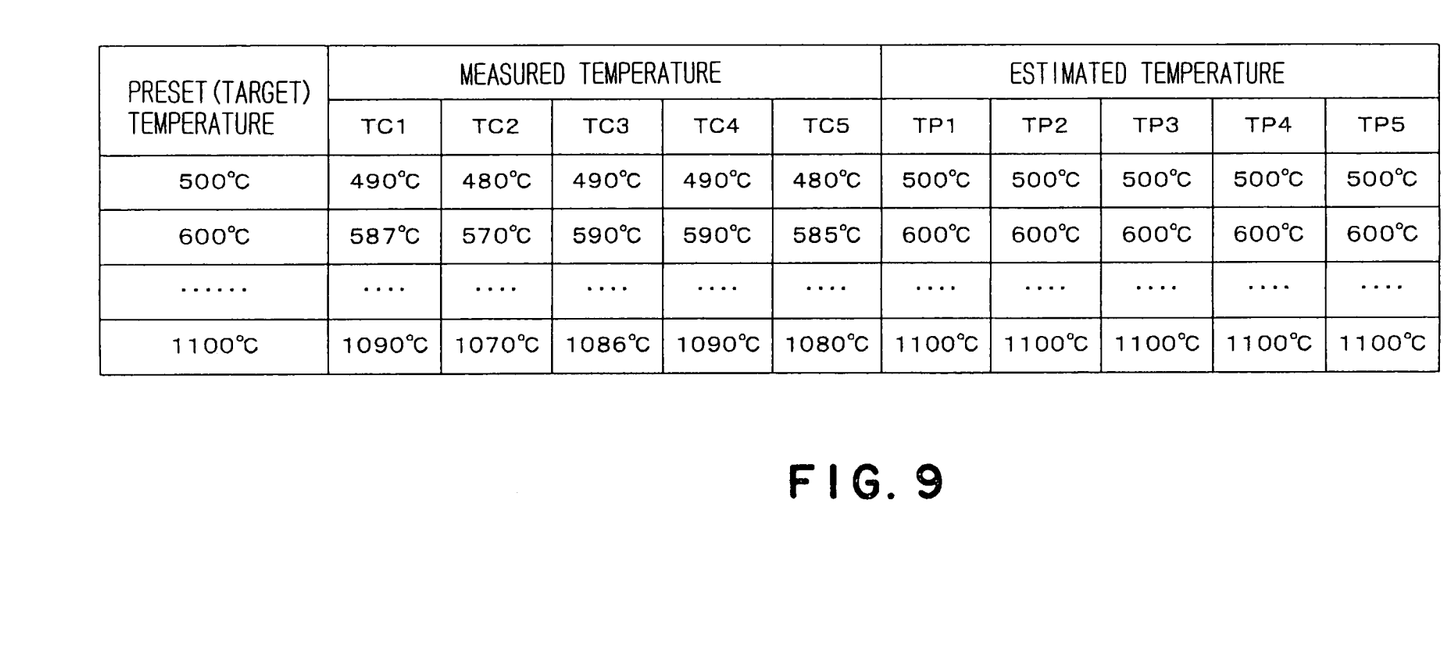
FIG. 9 is a table in which estimated temperatures estimated by the standard thermal model and actual temperatures are stored in coordination with respect to each preset temperature defined by a setup recipe.

Note that the correction value may be a fixed value or may be in a form of a function. For instance, if "estimated value TPi minus measured value TRi" varies widely as shown in FIG. 9, a linear function f(T) (T: estimated temperature by the standard thermal model M1) that represents the correction values may be derived by using least squares method, for example.

Next, the standard thermal model M1 is calibrated (step S19). That is, the standard thermal model M1 is corrected so that values represented by the following expression 2 coincide with the estimated values respectively.

Estimated temperature $i =$ Temperature $i$ estimated by the standard thermal model $M1 -$ Correction value $i$  [Expression 2]

Figure 10:
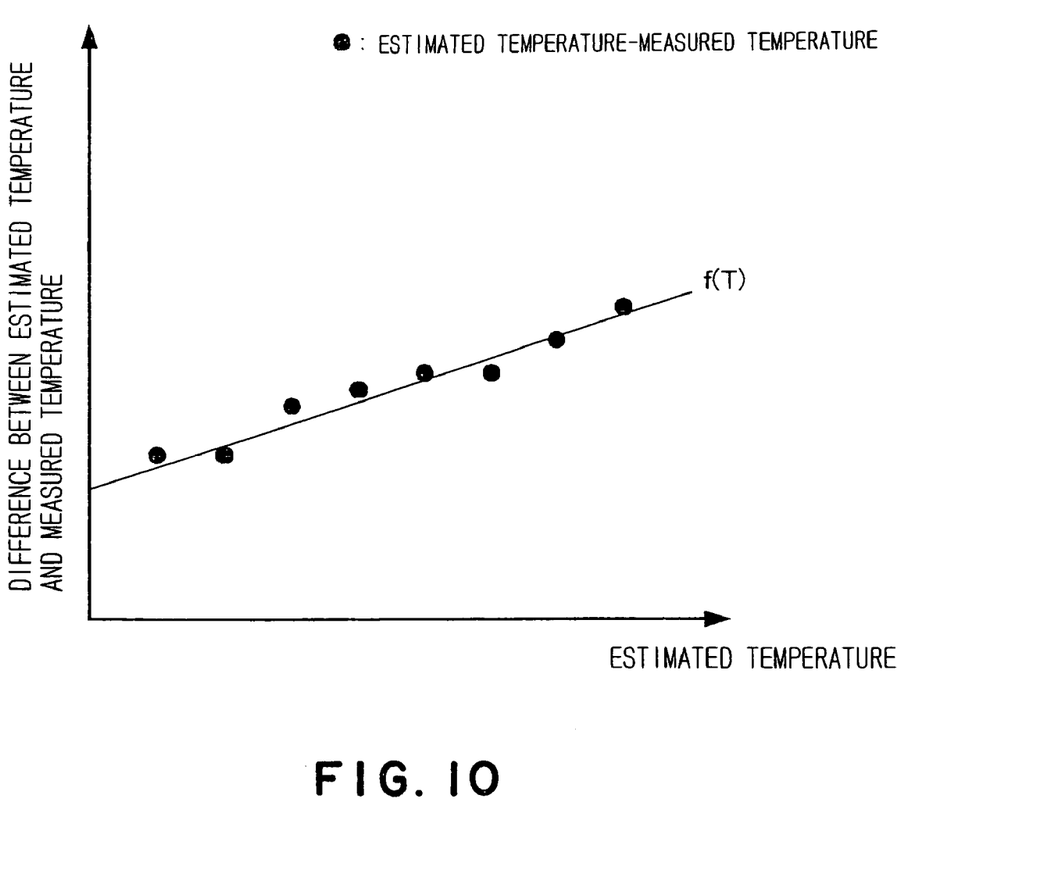
FIG. 10 is a graph for explanation of a method of correcting the standard thermal model.

For instance, if the correction values are represented by a function f(T) as shown in FIG. 10 and a temperature estimated by the standard thermal model M1 is T0, the standard thermal model M1 is corrected so that a estimated temperature becomes "T0−f(T0)".

Next, the standard thermal model M1 is corrected so that it is capable of precise estimation of the surface temperatures of the top heater 32 and the bottom heater 33 in the processing vessel 11 (step S20). This correcting operation will be described with reference to FIG. 8.

First, the temperature in the processing vessel 11 is controlled to be maintained at a predetermined constant value Tcons, waiting for the system being stabilized. Next, with the use of the standard thermal model M1 before renewal, temperatures of the temperature sensors S4 and S5 are estimated. In addition, the temperature of the temperature sensors S4 and S5 are measured (step S21).

Next, the estimated values and the measured values of the temperatures of the temperature sensors S4 and S5 are compared, and correction values are calculated in a manner similar to that shown by expression 1 (step S22).

Then, as for the top heater 32, a correlation between a variation ΔTt of the surface temperature of the top heater 32 and variations ΔTs1 to ΔTs5 of the temperatures of the sensors S1 to S5 is obtained by using a system model including the heater controller 123 (step S23).

That is, a matrix Kt (expression 3) satisfying the following expression 4 is derived.

$$Kt = [Kt1, Kt2, Kt3, Kt4, Kt5] \quad \text{[Expression 3]}$$

$$\Delta Tt = [Kt1, Kt2, Kt3, Kt4, Kt5] \cdot \begin{bmatrix} \Delta Ts1 \\ \Delta Ts2 \\ \Delta Ts3 \\ \Delta Ts4 \\ \Delta Ts5 \end{bmatrix} \quad \text{[Expression 4]}$$

Then, as for the bottom heater 33, a correlation between a variation ΔTb of the surface temperature of the bottom heater 33 and variations ΔTs1 to ΔTs5 of the temperatures of the sensors S1 to S5 is obtained by using a system model including the heater controller 123 (step S23).

That is, a matrix Kb (Expression 5) satisfying the following expression 6 is derived.

$$Kb = [Kb1, Kb2, Kb3, Kb4, Kb5] \quad \text{[Expression 5]}$$

$$\Delta Tb = [Kb1, Kb2, Kb3, Kb4, Kb5] \cdot \begin{bmatrix} \Delta Ts1 \\ \Delta Ts2 \\ \Delta Ts3 \\ \Delta Ts4 \\ \Delta Ts5 \end{bmatrix} \quad \text{[Expression 6]}$$

Next, the standard thermal model M1 is calibrated by applying the above correlations to portions, which relate to the estimation of the temperature of the top heater 32 and the same of the bottom heater 33, of the standard thermal model M1, as shown by the following expressions 7 and 8 (step S24).

$$\text{Temperature of the top heater } 32 = \quad \text{[Expression 7]}$$
$$\text{Temperature estimated by standard thermal model } M1 + [Kt1, Kt2, Kt3, Kt4, Kt5] \cdot$$
$$\begin{bmatrix} 0 \\ 0 \\ 0 \\ \left(\begin{array}{c}\text{Estimated Temperature of Temperature Sensor } S4 \\ - \\ \text{Measured Temperature of Temperature Sensor } S4\end{array}\right) \\ 0 \end{bmatrix}$$

$$\text{Temperature of the bottom heater } 33 = \quad \text{[Expression 8]}$$
$$\text{Temperature estimated by standard thermal model } M1 + [Kb1, Kb2, Kb3, Kb4, Kb5] \cdot$$
$$\begin{bmatrix} 0 \\ 0 \\ 0 \\ \left(\begin{array}{c}\text{Estimated Temperature of Temperature Sensor } S5 \\ - \\ \text{Measured Temperature of Temperature Sensor } S5\end{array}\right) \\ 0 \end{bmatrix}$$

In the above way, the process of calibrating (customizing) the standard thermal model M1 for this apparatus is completed. Then, the loaded boat 26 is unloaded.

The so-customized standard thermal model M1, namely, a calibrated thermal model M2 is stored in the thermal model storage part 111 (step S25), and is subsequently used for estimating the temperatures in the positions P1 to P5 of the wafers W and the surface temperatures of the top heater 32 and the bottom heater 33.

When performing a process by the heat treatment apparatus 1 thus set up, a process recipe R2 corresponding to the process to be performed is stored in the recipe storage part 112. Then, the process is carried out while estimating the temperatures of the wafers W, the top heater 32 and the bottom heater 33 by using the calibrated thermal model M2. As the calibrated thermal model M2 has been calibrated for this heat treatment apparatus 1, it is possible to estimate the temperatures of the wafers W and the heaters 32 and 33 precisely. Further, if the process result should be out of the allowable range, it is possible to readily discriminate whether the result is caused by a thermal factor or the other factor.

Note that this invention is not limited to the above-mentioned embodiment, and various modifications and applications are possible. For instance, the invention may be modified as follows: measuring the temperatures of the top heater 32 and the bottom heater 33 by means of e.g., radiation thermometers or the like; calculating correction values based on estimated values by using the standard thermal model M1 and actually-measured values by using the radiation thermometers; and correcting the estimated temperatures by using the correction values.

The number of temperature sensors for the estimation and the arrangement of the sensors may be modified. The number of the temperature sensors is not limited to five. The temperature sensors may be arranged on an inner surface of the wall of the processing vessel 11.

The heat treatment apparatus 1 on application of the present invention may be optionally modified, without being limited to the above-mentioned embodiment. For instance, the processing vessel 1 may be of a double-tube structure. The boat 26 may be modified so that the number of semiconductor wafers W accommodated therein is more than (e.g., about 100 to 150 pcs.) or less than (e.g., 15 to 30 pcs.) that shown in the embodiment.

Although the present invention has been described with the above-mentioned embodiment taking a CVD apparatus as an example, any sort of treatment is possible. The present invention is applicable not only to a CVD apparatus but also to various sorts of batch-type heat treatment apparatuses, such as an oxidation apparatus and an etching apparatus.

The constitution and operations of instruments are not limited to those in the above-mentioned embodiment. For instance, although the above-mentioned embodiment is provided with three sidewall heaters and two inner heaters, the number and arrangement of the heaters are optional. The heater is not limited to a resistant heater, and may be a lamp. The arrangement for measuring the temperature of the wafers and the like is not limited to a thermocouple, and any sort of temperature sensor is applicable.

The thermal model and its design technique is not limited to those disclosed in U.S. Pat. No. 5,517,594, and any model and any design technique are applicable.

At least a part of the computer program for performing the above-mentioned calibration process may be stored in a computer-readable recording medium for distribution, such as CD-ROM and DVD-ROM, may be transferred to the RAM 114 through the I/O port 115, and may be executed by the CPU 116, to carry out the above calibration process. Alternatively, the program may be transferred to the I/O port 115 through a network.

The invention claimed is:

1. A calibrating method for a heat treatment apparatus that includes a processing vessel for accommodating process objects therein, a plurality of heaters and a plurality of temperature sensors; that stores a thermal model for estimating temperature of the process objects in the processing vessel based on outputs of the temperature sensors; that estimates the temperature of the process objects in the processing vessel based on the outputs of the temperature sensors by using the thermal model; and that controls the heaters based on the estimated temperature, to perform a heat treatment to the process objects, wherein the thermal model has a function of estimating temperature of one of the heaters and temperature of the temperature sensors, said method comprising the steps of:

driving the heaters to heat an interior of the processing vessel; and calibrating a part of the thermal model involving temperature estimation of said one of the heaters wherein the calibrating step includes the steps of:

determining a matrix $[K1, K2 \ldots, Kn]$ expressing relationship between an amount of change in the temperature of said one of the heaters and amounts of change in the measured temperatures of the temperature sensors, wherein the matrix is determined so as to satisfy the expression $$\Delta T = [K1, K2, \ldots, Kn] \cdot \begin{bmatrix} \Delta Ts1 \\ \Delta Ts2 \\ \vdots \\ \Delta Tsn \end{bmatrix}$$

where $\Delta T$ is said amount of change in the temperature of said heaters and $\Delta Ts1 \ldots, \Delta Tsn$ are said amounts of change in the measured temperatures of the respective temperature sensors;

determining a difference between an estimated temperature of one of the temperature sensors located closest to the said one of the heaters, as estimated by using the thermal model, and an actual temperature of said one of the temperature sensors measured by the same; and calculating the correction value according to the following expression $$\text{Correction value} = [K1, K2, \ldots, Kn] \cdot \begin{bmatrix} a1 \\ a2 \\ \vdots \\ an \end{bmatrix}$$

wherein said difference is assigned to one of "a1", "a2", . . . "an" corresponding to said one of the temperature sensors located closest to said one of the heaters, while zero is assigned to the remainder of "a1", "a2," . . . "an".

2. The calibrating method according to claim 1, wherein said one of the heaters is disposed in the processing vessel.

3. A calibrating method for a heat treatment apparatus that includes a processing vessel for accommodating, process objects therein, a plurality of heaters and a plurality of temperature sensors; that stores a thermal model for estimating temperature of the process objects in the processing vessel based on outputs of the temperature sensors; that estimates the temperature of the process objects in the processing vessel based on the outputs of the temperature sensors by using the thermal model; and that controls the heaters based on the estimated temperature, to perform a heat treatment to the process objects, wherein the plurality of heaters include first and second heaters arranged above and below the process objects in the processing vessel, respectively, and the thermal model has a function of estimating temperature of one of the heater and temperature of the temperature sensors, said method comprising the steps of:

driving the heaters to heat an interior of the processing vessel; and calibrating parts of the thermal model involving temperature estimation of the first and second heaters by determining first and second correction values which are to be added or subtracted to or from estimated temperatures of the first and second heaters, respectively, wherein the calibrating step includes the steps of:

determining a matrix $[Kt1, Kt2, \ldots Ktn]$ expressing relationship between an amount of change in the temperature of the first heater and amounts of change in the measured temperatures of the temperature sensors, wherein the matrix is determined so as to satisfy the following expression $$\Delta Tt = [Kt1, Kt2, \ldots, Ktn] \cdot \begin{bmatrix} \Delta Ts1 \\ \Delta Ts2 \\ \vdots \\ \Delta Tsn \end{bmatrix}$$

where $\Delta Tt$ is said amount of change in the temperature of the first heater and $\Delta Ts1 \ldots, \Delta Tsn$ are said amounts of change in the measured temperatures of the respective temperature sensors;

determining a first difference between an estimated temperature of one of the temperature sensors located closest to the first heater, as estimated by using the thermal model, and an actual temperature of the temperature sensor closest to the first heater as measured by the temperature sensors located closest to the first heater;

calculating a the first correction value according to the following expression $$\text{Correction value} = [Kt1, Kt2, \ldots, Ktm] \cdot \begin{bmatrix} a1 \\ a2 \\ \vdots \\ an \end{bmatrix}$$

wherein said first difference is assigned to one of "a1", "a2", ... "an" corresponding to said one of the temperature sensors located closest to the first heater, while zero is assigned to the remainder of "a1", "a2," ... "an";

determining a matrix [Kb1, Kb2, ... Kbn] expressing relationship between an amount of change in the temperature of the second heater and amounts of change in the measured temperatures of the temperature sensors, wherein the matrix is determined so as to satisfy the following expression $$\Delta Tb = [Kb1, Kb2, \ldots, Kbn] \cdot \begin{bmatrix} \Delta Ts1 \\ \Delta Ts2 \\ \vdots \\ \Delta Tsn \end{bmatrix}$$

where $\Delta Tb$ is said amount of change in the temperature of the second heater and $\Delta Ts1 \ldots, \Delta Tsn$ are said amounts of change in the measured temperatures of the respective temperature sensors;

determining a second difference between an estimated temperature of one of the temperature sensors located closest to the second heater, as estimated by using the thermal model, and an actual temperature of the temperature sensor closest to the second temperature sensor measured by the temperature sensor closest to the second temperature sensor; and calculating the second correction value according to the following expression $$\text{Correction value} = [Kb1, Kb2, \ldots, Kbn] \cdot \begin{bmatrix} b1 \\ b2 \\ \vdots \\ bn \end{bmatrix}$$

wherein said second difference is assigned to one of "b1", "b2", ... "bn" corresponding to said one of the temperature sensors located closest to the second heater, while zero is assigned to the remainder of "b1", "b2," ... "bn".

4. A heat treatment apparatus comprising:
a processing vessel for accommodating process objects therein, a plurality of heaters and a plurality of temperature sensors; and
a controller that stores a thermal model for estimating temperature of the process objects in the processing vessel based on outputs of the temperature sensors; that estimates the temperature of the process objects in the processing vessel based on the outputs of the temperature sensors by using the thermal model; and that controls the heaters, based on the estimated temperature, to perform a heat treatment to the process objects, the controller including:
means for driving the heaters to heat an interior of the processing vessel; and
means for calibrating a part of the thermal model involving temperature estimation of one of the heaters by determining a correction value which is to be added or subtracted to or from an estimated temperature of one of the heaters,
wherein the calibrating means is configured:
to determine a matrix [K1, K2, ..., Kn] expressing relationship between an amount of change in the temperature of said one of the heaters and amounts of change in the measured temperatures of the temperature sensors, wherein the matrix is determined to satisfy the expression $$\Delta T = [K1, K2, \ldots, Kn] \cdot \begin{bmatrix} \Delta Ts1 \\ \Delta Ts2 \\ \vdots \\ \Delta Tsn \end{bmatrix}$$

where $\Delta T$ is said amount of change in the temperature of said heaters and $\Delta Ts1 \ldots, \Delta Tsn$ are said amounts of change in the measured temperatures of the respective temperature sensors;

to determine a difference between an estimated temperature of one of the temperature sensors located closest to the said one of the heaters, as estimated by using the thermal model, and an actual temperature of the said one of the temperature sensors measured by the same; and to calculate a correction value according to the following expression $$\text{Correction value} = [Kt1, Kt2, \ldots, Kn] \cdot \begin{bmatrix} a1 \\ a2 \\ \vdots \\ an \end{bmatrix}$$

wherein said difference is assigned to one of "a1", "a2", ... "an" corresponding to said one of the temperature sensors located closest to said one of the heaters, while zero is assigned to the remainder of "a1", "a2," ... "an".

5. The heat treatment apparatus according to claim 4, wherein said one of the heaters is disposed in the processing vessel.

6. A heat treatment apparatus comprising:
a processing vessel for accommodating process objects therein, a plurality of heaters and a plurality of temperature sensors; and
a controller that stores a thermal model for estimating temperature of the process objects in the processing vessel based on outputs of the temperature sensors; that estimates the temperature of the process objects in the processing vessel based on the outputs of the temperature sensors by using the thermal model; and that controls the heaters, based on the estimated temperature, to perform a heat treatment to the process objects, the controller including:
means for driving the heaters to heat an interior of the processing vessel; and
means for calibrating a part of the thermal model involving temperature estimation of the first and second heaters, by determining first and second correction values which are to be added or subtracted to or from estimated temperatures of the first and second heaters, respectively, wherein the controller is configured:

to determine a matrix [Kt1, Kt2, . . . , Ktn] expressing relationship between an amount of change in the temperature of the first heater and amounts of change in the measured temperatures of the temperature sensors, wherein the matrix is determined so as to satisfy the following expression $$\Delta Tt = [Kt1, Kt2, \ldots , Ktn] \cdot \begin{bmatrix} \Delta Ts1 \\ \Delta Ts2 \\ \vdots \\ \Delta Tsn \end{bmatrix}$$

where $\Delta Tt$ is said amount of change in the temperature of the first heater and $\Delta Ts1$ . . . , $\Delta Tsn$ are said amounts of change in the measured temperatures of the respective temperature sensors;

to determine a first difference between an estimated temperature of one of the temperature sensors located closest to the first heater, as estimated by using the thermal model, and an actual temperature of the temperature sensor closest to the first heater measured by the temperature sensor closest to the first heater;

to calculate the first correction value according to the following expression $$\text{Correction value} = [Kt1, Kt2, \ldots , Ktn] \cdot \begin{bmatrix} a1 \\ a2 \\ \vdots \\ an \end{bmatrix}$$

wherein said difference is assigned to one of "a1", "a2", . . . "an" corresponding to said one of the temperature sensors located closest to said one of the heaters, while zero is assigned to the remainder "a1", "a2," . . . "an";

to determine a matrix [Kb1, Kb2, . . . , Kbn] expressing relationship between an amount of change in the temperature of the second heater and amounts of change in the measured temperatures of the temperature sensors, wherein the matrix is determined to satisfy the following expression $$\Delta Tb = [Kb1, Kb2, \ldots , Kbn] \cdot \begin{bmatrix} \Delta Ts1 \\ \Delta Ts2 \\ \vdots \\ \Delta Tsn \end{bmatrix}$$

where $\Delta Tb$ is said amount of change in the temperature of the second heater and $\Delta Ts1$ . . . , $\Delta Tsn$ are said amounts of change in the measured temperatures of the respective temperature sensors;

to determine a second difference between an estimated temperature of one of the temperature sensors located closest to the second heater, as estimated by using the thermal model, and an actual temperature of the temperature sensor closest to the second temperature sensor as measured by the temperature sensor closest to the second temperature sensor; and to calculate the second correction value according to the following expression $$\text{Correction value} = [Kb1, Kb2, \ldots , Kbn] \cdot \begin{bmatrix} b1 \\ b2 \\ \vdots \\ bn \end{bmatrix}$$

wherein said second difference is assigned to one of "b1", "b2", . . . "bn" corresponding to said one of the temperature sensors located closest to the second heater, while zero is assigned to the remainder of "b1", "b2," . . . "bn".

* * * * *